(12) United States Patent
Cho et al.

(10) Patent No.: US 9,620,715 B2
(45) Date of Patent: Apr. 11, 2017

(54) THERMAL TRANSFER FILM, METHOD FOR MANUFACTURING SAME, AND ORGANIC ELECTROLUMINESCENT DEVICE MANUFACTURING THEREFROM

(71) Applicant: CHEIL INDUSTRIES INC., Gumi-si, Gyeongsangbuk-do (KR)

(72) Inventors: Seong Heun Cho, Uiwang-si (KR); Kyoung Ku Kang, Uiwang-si (KR); Se Hyun Park, Uiwang-si (KR); Si Kyun Park, Uiwang-si (KR); Eun Gon Lee, Uiwang-si (KR); Hyoung Tae Im, Uiwang-si (KR); Jung Hyo Lee, Uiwang-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 14/653,231

(22) PCT Filed: Jun. 12, 2013

(86) PCT No.: PCT/KR2013/005179
§ 371 (c)(1),
(2) Date: Jun. 17, 2015

(87) PCT Pub. No.: WO2014/098332
PCT Pub. Date: Jun. 26, 2014

(65) Prior Publication Data
US 2015/0333259 A1    Nov. 19, 2015

(30) Foreign Application Priority Data

Dec. 18, 2012  (KR) .................. 10-2012-0148928

(51) Int. Cl.
*B41M 5/46* (2006.01)
*H01L 51/00* (2006.01)
(Continued)

(52) U.S. Cl.
CPC .......... *H01L 51/0013* (2013.01); *B41M 5/46* (2013.01); *B41M 2205/30* (2013.01);
(Continued)

(58) Field of Classification Search
CPC  B41M 5/46; B41M 2205/30; B41M 2205/34; B41M 2205/36; B41M 2205/38;
(Continued)

(56) References Cited

U.S. PATENT DOCUMENTS 7,387,864 B2 *  6/2008  Felder .................. B41M 5/41
                                                  430/200
8,062,824 B2 * 11/2011  Bailey .................. B41M 5/46
                                                  428/32.74

FOREIGN PATENT DOCUMENTS

JP    2009-259802 A    11/2009
JP    2010-274539 A    12/2010
(Continued)

OTHER PUBLICATIONS

International Search Report dated Sep. 27, 2013 for PCT/KR2013/005179, 4 pages.

*Primary Examiner* — Bruce H Hess
(74) *Attorney, Agent, or Firm* — Lewis Roca Rothgerber Christie LLP

(57) ABSTRACT

The present invention relates to a thermal transfer film comprising: a photothermal conversion layer; and a diffusion member formed on the upper surface of said photothermal conversion layer, wherein the diffusion member is a thermal transfer film having about 10% or more of the haze, and also relates to a method for manufacturing same, and to an organic electroluminescent device manufactured using said method.

29 Claims, 2 Drawing Sheets

(51) Int. Cl.
*H01L 51/50* (2006.01)
*H01L 51/56* (2006.01)

(52) U.S. Cl.
CPC ..... *B41M 2205/36* (2013.01); *B41M 2205/38* (2013.01); *B41M 2205/40* (2013.01); *H01L 51/5012* (2013.01); *H01L 51/56* (2013.01); *Y02E 10/549* (2013.01); *Y02P 70/521* (2015.11); *Y10T 428/24612* (2015.01); *Y10T 428/24802* (2015.01); *Y10T 428/31511* (2015.04)

(58) Field of Classification Search
CPC  B41M 2205/40; H01L 51/00; H01L 51/0013; H01L 51/50; H01L 51/5012
USPC .............................................. 428/32.8, 32.81
See application file for complete search history.

(56) References Cited

FOREIGN PATENT DOCUMENTS

| | | |
|---|---|---|
| JP | 2012-094574 A | 5/2012 |
| KR | 10-0654649 B1 | 12/2006 |
| KR | 10-2007-0084022 A | 8/2007 |
| KR | 10-2011-0008790 A | 1/2011 |

* cited by examiner

THERMAL TRANSFER FILM, METHOD FOR MANUFACTURING SAME, AND ORGANIC ELECTROLUMINESCENT DEVICE MANUFACTURING THEREFROM

CROSS-REFERENCE TO RELATED APPLICATION(S)

This application is a national stage of International Application No. PCT/KR2013/005179 filed Jun. 12, 2013, which claims priority to and the benefit of Application No. KR 10-2012-0148928, filed in the Korean Intellectual Property Office on Dec. 18, 2012, the entire contents of both of which are incorporated herein by reference.

TECHNICAL FIELD

The present invention relates to a thermal transfer film, a method for manufacturing the same, and an organic electroluminescent device manufactured using the same.

BACKGROUND ART

A thermal transfer film includes a light-to-heat conversion (LTHC) layer. The light-to-heat conversion layer absorbs light in a certain wavelength range and converts at least some of the absorbed light into heat. For light-induced thermal transfer, it is desirable that the light-to-heat conversion layer maintain a uniform surface without reducing optical density.

The thermal transfer film further includes a base film which transfers incident laser light to the light-to-heat conversion layer. However, most base films include foreign matters therein. The foreign matters disturb an optical path of the laser light, thereby obstructing transfer of the laser light to the light-to-heat conversion layer and causing transfer failure.

FIG. 5 is a cross-sectional view of a thermal transfer film which includes a base film 10, a light-to-heat conversion layer 20, an interlayer 30, and a transfer layer 40. Foreign matter 50 in the base film 10 can disturb suitable delivery of the laser light to the light-to-heat conversion layer 20. As a result, transfer failure can occur.

In this regard, Korean Patent Registration No. 10-0654649 discloses a thermal transfer element that comprises a transfer layer containing multiple components constructed and arranged to emit or produce light.

Considering a recent trend of providing finer patterns, there is a need for a thermal transfer film capable of preventing transfer failure caused by foreign matter in a base film.

DISCLOSURE

Technical Problem

It is one aspect of the present invention to provide a thermal transfer film that is free from disturbance of an optical path of laser light and transfer failure caused by foreign matters in a base film.

It is another aspect of the present invention to provide a thermal transfer film that can achieve perfect transfer by providing uniform irradiance of laser light on a laser light exiting portion and allowing uniform delivery of the laser light to a light-to-heat conversion layer.

It is a further aspect of the present invention to provide a method for manufacturing the thermal transfer film as set forth above.

It is yet another aspect of the present invention to provide an organic electroluminescent device manufactured using the thermal transfer film as set forth above.

Technical Solution

In accordance with one aspect of the present invention, a thermal transfer film may include: a light-to-heat conversion layer; and a diffusion member formed on an upper surface of the light-to-heat conversion layer, wherein the diffusion member may have a haze of about 10% or more.

The diffusion member may include a base film having a diffusion layer formed thereon or a base film including a diffusing agent.

The diffusion layer may include at least one of an optical pattern layer and a diffusing agent-containing layer.

The diffusion member may include a base film having an optical pattern layer formed at a light incident portion of the thermal transfer film.

A difference in refractive index between the optical pattern layer and the base film may range from about 0.03 to about 0.2.

The optical pattern layer may include at least one optical pattern of a lenticular lens pattern, a microlens pattern, an embossed pattern, and a prism pattern.

The optical pattern layer may be integrally formed with the base film.

The optical pattern layer may further include a diffusing agent.

The diffusion member may include a base film having the diffusing agent-containing layer formed on one surface thereof.

A difference in refractive index between a resin of the diffusing agent-containing layer and the diffusing agent may range from about 0.03 to about 0.25.

The diffusing agent-containing layer may have a thickness of about 1 μm to about 20 μm.

The diffusing agent-containing layer may be formed of a composition including a UV curable resin and a diffusing agent.

A difference in refractive index between the UV curable resin and the diffusing agent may range from about 0.03 to about 0.2.

The diffusing agent may be contained in an amount of about 10 wt % to about 80 wt % in the diffusing agent-containing layer.

The UV curable resin may include at least one of (meth)acrylic, polycarbonate, styrene, olefin, and polyester resins.

The diffusing agent may include at least one of silica, styrene, (meth)acrylic, olefin, polyester, polycarbonate, siloxane, calcium carbonate, and aluminum oxide diffusing agents.

The thermal transfer film may further include an optical pattern layer formed on the other surface of the base film.

The optical pattern layer may include at least one of a lenticular lens pattern, a microlens pattern, an embossed pattern, and a prism pattern.

The diffusion member may be a base film comprising a diffusing agent.

A difference in refractive index between the diffusing agent and the base film may range from about 0.03 to about 0.25.

The diffusing agent may be comprised in an amount of about 2 wt % to about 50 wt % in the base film.

The diffusing agent may include at least one of silica, styrene, (meth)acrylic, olefin, polyester, polycarbonate, siloxane, calcium carbonate, and aluminum oxide diffusing agents.

The light-to-heat conversion layer may include cured products of a composition including a curable resin; a polyfunctional monomer; and a light-to-heat conversion material.

The light-to-heat conversion material may include at least one of dyes, pigments, carbon black, and tungsten oxide fine particles.

The thermal transfer film may further include an interlayer formed on a lower surface of the light-to-heat conversion layer.

The interlayer may include cured products of a composition including a curable resin; a polyfunctional monomer; a curable fluorine compound; and an initiator.

In accordance with another aspect of the present invention, a method for manufacturing a thermal transfer film may include: forming a diffusion member; and forming a light-to-heat conversion layer on the diffusion member.

In accordance with a further aspect of the present invention, an organic electroluminescent device may be manufactured using the thermal transfer film.

Advantageous Effects

The present invention provides a thermal transfer film, which can achieve perfect transfer by inducing scattering of laser light under a shadow of foreign matters present in a base film and providing uniform irradiance of the laser light on a laser light exiting portion so as to achieve uniform delivery of the laser light to a light-to-heat conversion layer, and a method for manufacturing the same.

BEST MODE

Figure 1:
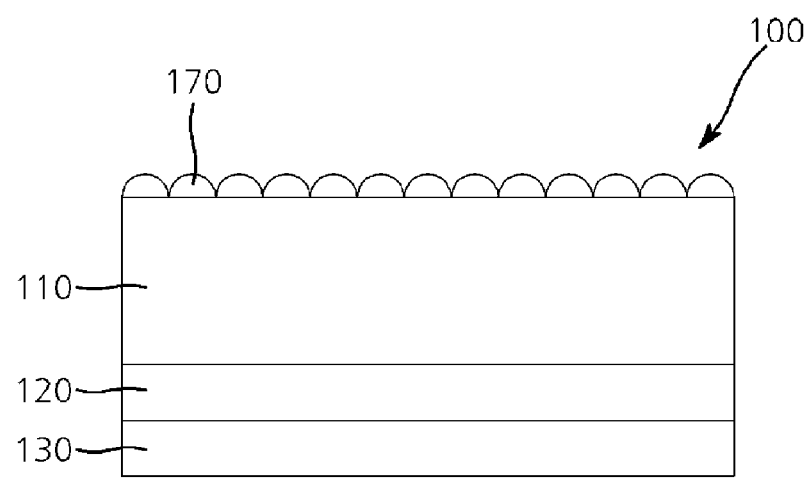
FIG. 1 is a cross-sectional view of a thermal transfer film according to one embodiment of the present invention.

Embodiments of the present invention will be described in detail with reference to the accompanying drawings. It should be understood that the present invention is not limited to the following embodiments and may be embodied in different ways. In the drawings, portions irrelevant to the description will be omitted for clarity. Like components will be denoted by like reference numerals throughout the specification.

As used herein, "one surface" faces "the other surface".

As used herein, directional terms such as "upper" and "lower" are defined with reference to the accompanying drawings. Thus, it will be understood that an "upper surface" can be used interchangeably with a "lower surface".

In accordance with one aspect of the present invention, a thermal transfer film may include a light-to-heat conversion layer; and a diffusion member formed on an upper surface of the light-to-heat conversion layer, wherein the diffusion member may have a haze of about 10% or more. Within this range of the haze value, the thermal transfer film can solve a transfer failure by inducing scattering of laser light under a shadow of foreign matters present in a base film so as to achieve uniform delivery of the laser light to the light-to-heat conversion layer. For example, the thermal transfer film may have a haze of about 20% to about 95%. Herein, the haze may be measured at a wavelength of 300 nm to 700 nm. The diffusion member may be formed at a portion of the thermal transfer film on which laser light is incident, may have a function of diffusing the laser light, and may enable uniform delivery of the laser light to the light-to-heat conversion layer.

In one embodiment, the diffusion member may be a base film having a diffusion layer formed thereon, and the diffusion layer may include at least one of an optical pattern layer and a diffusing agent-containing layer. In another embodiment, the diffusion member may be a base film containing a diffusing agent.

The thermal transfer film may further include an interlayer stacked on a lower surface of the light-to-heat conversion layer to minimize damage and contamination of a transfer layer, to reduce twisting of transfer materials in the transfer layer, and to enhance adhesion of the transfer layer to the light-to-heat conversion layer.

In one embodiment, the thermal transfer film may include a light-to-heat conversion layer; and a diffusion member formed on an upper surface of the light-to-heat conversion layer, wherein the diffusion member may include a base film having an optical pattern layer formed thereon, and the optical pattern layer may be formed at a light incident portion of the thermal transfer film.

FIG. 1 is a cross-sectional view of a thermal transfer film according to one embodiment of the present invention.

Referring to FIG. 1, a thermal transfer film 100 may include a light-to-heat conversion layer 120, an interlayer 130 formed on a lower surface of the light-to-heat conversion layer 120, a base film 110 formed on an upper surface of the light-to-heat conversion layer 120, and an optical pattern layer 170 formed on an upper surface of the base film 110. The optical pattern layer 170 corresponds to the laser light incident portion of the thermal transfer film and faces the light-to-heat conversion layer 120, with the base film 110 interposed therebetween.

A stack of the optical pattern layer and the base film is a diffusion member, which makes the laser light uniformly enter the light-to-heat conversion layer, thereby preventing transfer failure of the thermal transfer film.

A difference in refractive index between the optical pattern layer and the base film (the refractive index of the optical pattern layer—the refractive index of the base film) may be about 0.3 or less, for example, about 0.03 to about 0.2. Within this range, the thermal transfer film allows laser light incident on the thermal transfer film to uniformly reach a laser light exiting portion of the thermal transfer film.

As for the base film, any transparent film may be used so long as the transparent film transmits laser light. For example, the base film may be formed of at least one selected from the group consisting of polyester resins, polycarbonate resins, poly(meth)acrylic resins, polyepoxy resins, polyolefin resins, such as polyethylene resins, polypropylene resins, and the like, and polystyrene resins. Preferably, the base film may be a polyester film, such as a polyethyleneterephthalate (PET) film or a polyethylenenaphthalate film.

The base film may have a thickness of about 75 μm to about 125 μm, without being limited thereto.

The optical pattern layer may be formed of at least one resin forming the base film. The optical pattern layer and the base film may be formed of the same or different resins, preferably different resins.

The optical pattern layer may have a thickness (height) of about 2 μm to about 20 μm, without being limited thereto.

The optical pattern layer and the base film may be formed as discrete layers, as shown in FIG. 1. Here, the optical pattern layer may be formed by coating materials for the optical pattern layer onto the upper surface of the base film. Alternatively, the optical pattern layer may be integrally formed with the base film. Herein, the expression 'integrally formed with' may mean an integrated structure in which an adhesive layer is not interposed between the optical pattern layer and the base film and there is only a difference in shape therebetween. The integrated structure may be formed by patterning one surface of a resin for the base film to form an optical pattern, in a process of manufacturing the base film.

The optical pattern layer may include at least one optical pattern of a lenticular lens pattern, a microlens pattern, an embossed pattern, and a prism pattern. Preferably, the optical pattern may include the embossed pattern, as shown in FIG. 1, in order to secure uniformity of the laser light in the light exiting portion by scattering incident laser light.

The thermal transfer film can scatter incident light according to the shape of the optical pattern layer, and scattering of light can be increased with increasing surface roughness (surface area), thereby securing uniform delivery of incident laser light to the light exiting portion of the diffusion member.

The optical pattern layer may further include a diffusing agent to enhance the light scattering function of the optical pattern. The diffusing agent may include at least one of silica, styrene, (meth)acrylic, olefin, polyester, polycarbonate, siloxane, calcium carbonate, aluminum oxide diffusing agents or mixtures thereof. The diffusing agent may have any shape without limitation, and may have a spherical particle shape. The diffusing agent may be contained in an amount of about 10 wt % to about 80 wt % in the optical pattern layer.

The thermal transfer film may be manufactured by a manufacturing method that includes: forming an optical pattern layer on an upper surface of a base film, forming a light-to-heat conversion layer on a lower surface of the base film by coating a composition for the light-to-heat conversion layer onto the lower surface of the base film, followed by curing, and forming an interlayer on a lower surface of the light-to-heat conversion layer by coating a composition for the interlayer onto the lower surface of the light-to-heat conversion layer, followed by curing.

In another embodiment, the thermal transfer film may include a light-to-heat conversion layer; and a diffusion member formed on an upper surface of the light-to-heat conversion layer, wherein the diffusion member may include a base film having a diffusing agent-containing layer formed thereon, and the diffusing agent-containing layer may be formed between the base film and the light-to-heat conversion layer.

Figure 2:
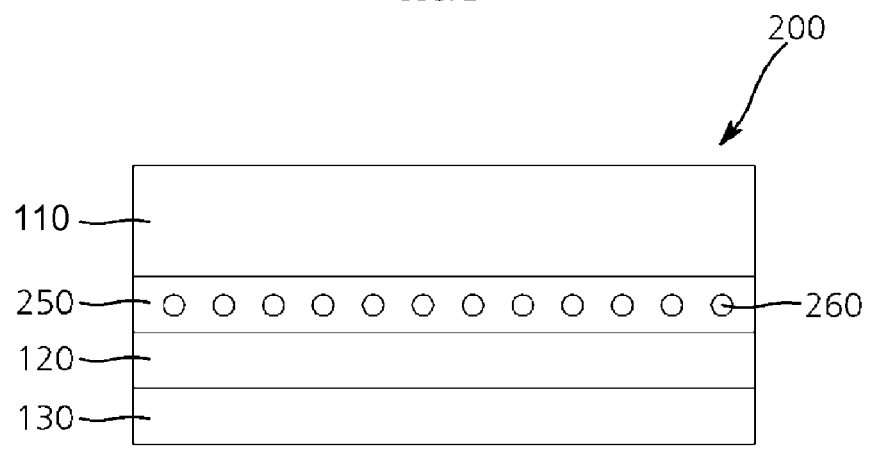
FIG. 2 is a cross-sectional view of a thermal transfer film according to another embodiment of the present invention.

FIG. 2 is a cross-sectional view of a thermal transfer film according to another embodiment of the present invention.

Referring to FIG. 2, a thermal transfer film 200 may include a light-to-heat conversion layer 120, an interlayer 130 formed on a lower surface of the light-to-heat conversion layer 120, a diffusing agent-containing layer 250 formed on an upper surface of the light-to-heat conversion layer 120 and containing a diffusing agent 260, and a base film 110 formed on an upper surface of the diffusing agent-containing layer 250.

A stack of the diffusing agent-containing layer and the base film may a diffusion member, which makes the laser light uniformly enter the light-to-heat conversion layer, thereby preventing transfer failure of the thermal transfer film.

The diffusing agent-containing layer may be composed of a single layer, as shown in FIG. 2, or may be composed of multiple layers. The diffusing agent-containing layer may have a thickness of about 1 μm to 20 μm.

A difference in refractive index between the diffusing agent-containing layer (specifically, a resin for the diffusing agent-containing layer) and the diffusing agent (the refractive index of the resin for the diffusing agent-containing layer—the refractive index of the diffusing agent) may be about 0.03 to about 0.25, for example, about 0.03 to about 0.2. Within this range, the thermal transfer film may have an effect of refracting incident light.

The diffusing agent-containing layer may be formed of a composition that includes the resin for the diffusing agent-containing layer (for example: UV (photo)—curable resin) and the diffusing agent. Specifically, the diffusing agent-containing layer may be formed by coating the composition onto one surface of the base film, followed by curing. Then, the light-to-heat conversion layer and the interlayer are sequentially formed on the diffusing agent-containing layer, thereby manufacturing a thermal transfer film. The light-to-heat conversion layer and the interlayer may be formed by the methods as described above. The composition may further include a dispersant for promoting dispersion of the diffusing agent, a solvent, an initiator, and the like. The dispersant, the solvent, and the initiator may be selected from compounds well known to those skilled in the art.

A difference in refractive index between the UV (photo)-curable resin and the diffusing agent (the refractive index of the UV (photo)-curable resin—the refractive index of the diffusing agent) may be about 0.3 or less. Within this range, the thermal transfer film may have an effect of refracting incident light. For example, the difference in refractive index between the UV (photo)-curable resin and the diffusing agent may range from about 0.03 to about 0.25, for example, about 0.03 to about 0.2.

The UV (photo)-curable resin may include a (meth) acrylic resin, a polycarbonate resin, a styrene resin, an olefin resin, a polyester resin, or a mixture thereof, without being limited thereto.

The diffusing agent may include particles having an average particle diameter of about 0.05 μm to about 10.0 μm.

The diffusing agent may include at least one of silica, styrene, (meth)acrylic, olefin, polyester, polycarbonate, siloxane, calcium carbonate, aluminum oxide diffusing agents and mixtures thereof.

The diffusing agent may be contained in an amount of about 10 wt % to about 80 wt % in the diffusing agent-containing layer. Within this range, the diffusing agent enables uniform delivery laser light without using an excess of the diffusing agent while reducing failure due to foreign matters.

Details of the base film are the same as those above.

Referring to FIG. 2, the diffusing agent-containing layer is formed on the lower surface of the base film. Alternatively, the diffusing agent-containing layer may be formed on an upper surface of the base film or in the base film.

The thermal transfer film may further include an optical pattern layer on the other surface of the base film, that is, a light incident portion of the thermal transfer film.

In a further embodiment, the thermal transfer film may include a light-to-heat conversion layer; and a diffusion member formed on an upper surface of the light-to-heat conversion layer, wherein the diffusion member may include a base film including a diffusing agent-containing layer formed thereon; and an optical pattern layer formed on an upper surface of the base film.

Figure 3:
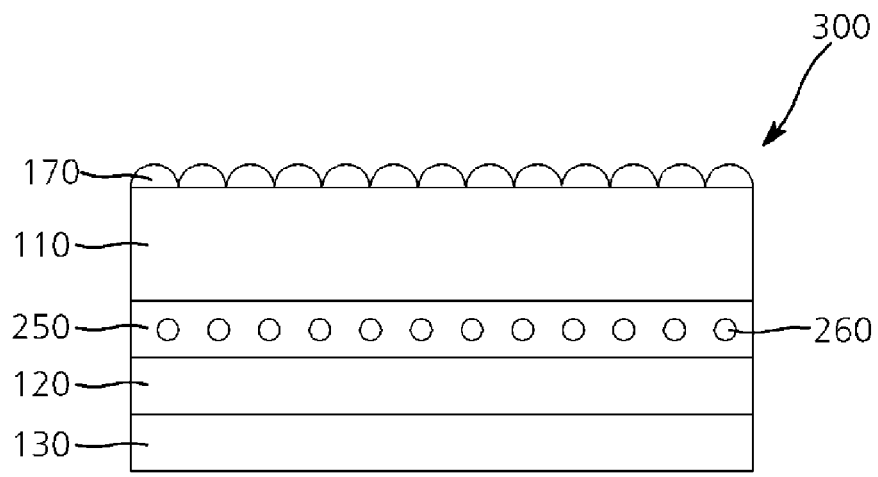
FIG. 3 is a cross-sectional view of a thermal transfer film according to a further embodiment of the present invention.

FIG. 3 is a cross-sectional view of a thermal transfer film according to a further embodiment of the present invention.

Referring to FIG. 3, a thermal transfer film 300 may include a light-to-heat conversion layer 120, an interlayer 130 formed on a lower surface of the light-to-heat conversion layer 120, a diffusing agent-containing layer 250 formed on an upper surface of the light-to-heat conversion layer 120 and containing a diffusing agent 260, a base film 110 formed on an upper surface of the diffusing agent-containing layer 250, and an optical pattern layer 170 formed on an upper surface of the base film 110.

A stack of the diffusing agent-containing layer, the base film and the optical pattern layer is a diffusion member, which makes the laser light uniformly enter the light-to-heat conversion layer, thereby preventing transfer failure of the thermal transfer film.

Details of the diffusing agent-containing layer and the optical pattern layer are the same as above.

In yet another embodiment, the diffusion member may be a base film including a diffusing agent. The thermal transfer film may include a light-to-heat conversion layer; and a diffusion member formed on an upper surface of the light-to-heat conversion layer, wherein the diffusion member may be the base film including the diffusing agent.

Figure 4:
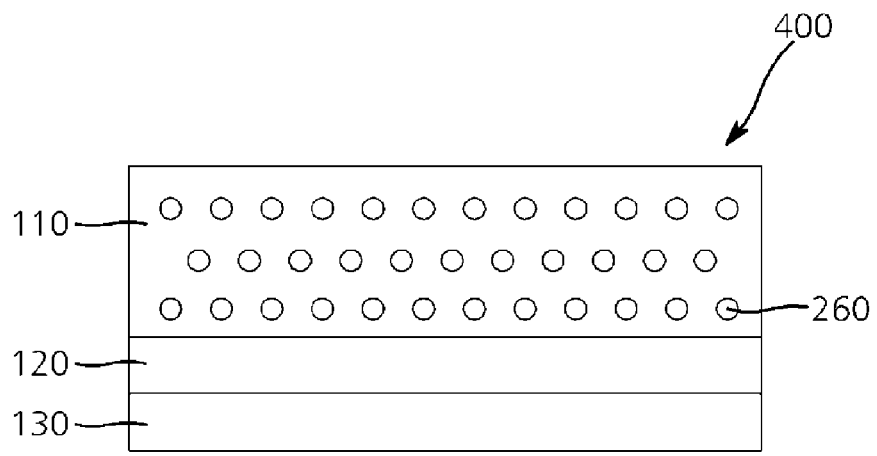
FIG. 4 is a cross-sectional view of a thermal transfer film according to yet another embodiment of the present invention.
Figure 5:
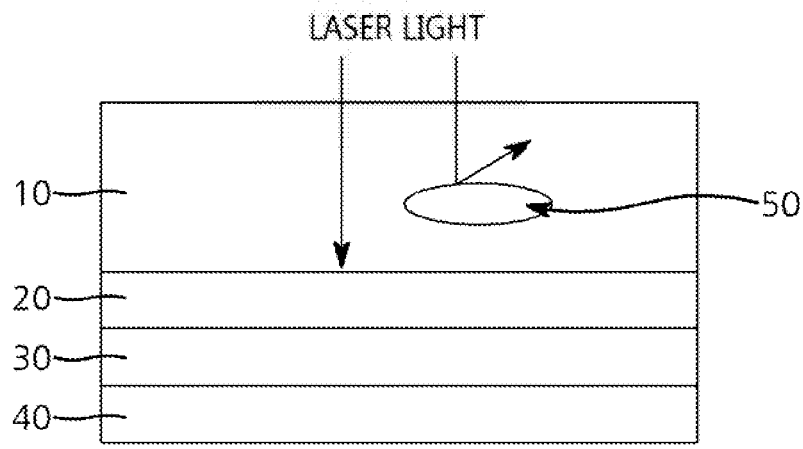
FIG. 5 is a cross-sectional view of transfer failure of a thermal transfer film including a base film containing foreign matters.

FIG. 4 is a cross-sectional view of a thermal transfer film according to yet another embodiment of the present invention.

Referring to FIG. 4, a thermal transfer film 400 may include a light-to-heat conversion layer 120, an interlayer 130 formed on a lower surface of the light-to-heat conversion layer 120, and a base film 110 formed on an upper surface of the light-to-heat conversion layer 120 and including a diffusing agent 260.

The base film including the diffusing agent is a diffusion member, which makes the laser light uniformly enter the light-to-heat conversion layer, thereby preventing transfer failure of the thermal transfer film.

The diffusion member may be manufactured by adding a certain amount of the diffusing agent in a typical process of forming the base film. The base film including the diffusing agent may be formed by adding the diffusing agent to a typical resin for the base film, followed by extrusion.

The diffusing agent may be included in an amount of about 2 wt % to about 50 wt % in the base film. Within this range of the diffusing agent, the thermal transfer film may have an effect of diffusing the laser light.

The diffusing agent may include at least one of silica, styrene, (meth)acrylic, olefin, polyester, polycarbonate, siloxane, calcium carbonate, aluminum oxide diffusing agents and mixtures thereof.

The diffusing agent may have any shape without limitation, and may have a spherical particle shape.

The diffusing agent may include particles having an average particle diameter of about 0.05 μm to about 5.0 μm.

The base film may be formed of a transparent resin typically used in thermal transfer films in the art. For example, the base film may be formed of at least one polymer resin selected from the group consisting of polyester resins, poly(meth)acrylic resins, polyepoxy resins, polyolefin resins, such as polyethylene resins, polypropylene resins, and the like, and polystyrene resins. Preferably, the base film is a polyester film, such as a polyethylene terephthalate (PET) film or a polyethylene naphthalate film.

The base film including the diffusing agent may have a thickness of about 75 μm to about 125 μm, without being limited thereto.

A difference in refractive index between the diffusing agent and the base film (the resin for the base film) (the refractive index of the diffusing agent—the refractive index of the base film) may range from about 0.03 to about 0.25, for example, from about 0.03 to about 0.2.

The light-to-heat conversion layer and the interlayer may be formed of typical compositions for thermal transfer films in the art.

The light-to-heat conversion layer may be formed of a composition, which includes a curable resin; a polyfunctional monomer; and a light-to-heat conversion material including dyes, pigments, and the like. The composition for the light-to-heat conversion layer may further include an initiator, for example, at least one of a thermal initiator and a photo initiator. In one embodiment, the light-to-heat conversion layer may be a cured product of a composition that includes about 50 wt % to about 85 wt % of the curable resin, about 10 wt % to about 40 wt % of the polyfunctional monomer, about 1 wt % to about 20 wt % of the light-to-heat conversion material, and about 1 wt % to about 10 wt % of the initiator.

The light-to-heat conversion layer may be formed by coating the composition for the light-to-heat conversion layer, followed by drying and curing.

The interlayer may include a polymer film, a metal layer, an inorganic layer (for example, a layer formed by sol-gel deposition or vapor deposition of an inorganic oxide such as silica, titania or other metal oxides), and an organic/inorganic composite layer. An organic material included in the composite layer may include a thermosetting material, a thermoplastic material, or a mixture thereof.

In addition, the interlayer may be formed of a composition, which includes a curable resin, a polyfunctional monomer, a curable fluorine compound, and an initiator. In one embodiment, the composition for the interlayer may include about 50 wt % to about 85 wt % of the curable resin, about 10 wt % to about 40 wt % of the polyfunctional monomer, about 1 wt % to about 10 wt % of the curable fluorine compound, and about 1 wt % to about 10 wt % of the initiator in terms of solid content. The interlayer may be formed by coating the composition for the interlayer, followed by drying and curing.

The curable resin may be a UV curable resin, and may include urethane(meth)acrylate, epoxy(meth)acrylate, polymethyl(meth)acrylate, epoxy novolac(meth)acrylate, ethylene glycol di(meth)acrylate, neopentyl glycol di(meth)acrylate, 1,6-hexanediol(meth)acrylate, trimethylolpropane tri(meth)acrylate, dipentaerythritol hexa(meth)acrylate, polyol poly(meth)acrylate, di(meth)acrylate of bisphenol A-diglycidyl ether, polyester(meth)acrylate, which is obtainable by esterification of a polyhydric alcohol and a polyhydric carboxylic acid and/or anhydrides thereof and (meth)acrylic acid, polysiloxane poly(meth)acrylate, pentaerythritol tetra(meth)acrylate, glycerine tri(meth)acrylate, and the like. In addition, the curable resin may a fluorinated (meth)acrylate oligomer or pre-polymer. For example, the curable resin may contain a fluorinated epoxy(meth)acrylate or a fluorinated alkoxysilane.

The polyfunctional monomer may include a polyfunctional (meth)acrylate, for example, a polyfunctional (meth)acrylate containing hydroxyl group, a fluorinated polyfunctional (meth)acrylate, or a mixture thereof, without being limited thereto.

The light-to-heat conversion material may include dyes, pigments, and the like. For example, the light-to-heat conversion material may include carbon black, tungsten oxide fine particles, and the like.

The initiator may include a typical thermal initiator and a photo initiator.

The curable fluorine compound is a UV curable fluorine compound, which has a perfluoro group and a (meth)acrylate group, and may be 1H,1H,10H,10H-perfluoro-1,10-decandiol di(meth)acrylate.

The thermal transfer film may further include a transfer layer formed on a lower surface of the light-to-heat conversion layer or a lower surface of the interlayer. The transfer layer may include at least one layer for transferring a transfer material to a receptor. These may be formed of organic, inorganic, organometallic and other materials, which include electroluminescent or electrically active materials.

In accordance with another aspect of the present invention, a method for manufacturing a thermal transfer film may include: forming a diffusion member; and forming a light-to-heat conversion layer on the diffusion member.

The method may further include forming an interlayer on the light-to-heat conversion layer.

In accordance with a further aspect of the present invention, an organic electroluminescent device may be manufactured using the thermal transfer film. The thermal transfer film may be used as a donor film in manufacture of the organic electroluminescent device, and a typical method is used to manufacture the organic electroluminescent device using the thermal transfer film. For example, the organic electroluminescent device may be manufactured by preparing a donor film having an EML by stacking an organic luminescent material on the thermal transfer film, laminating a substrate and the donor film, followed by patterning through irradiation with laser light.

MODE FOR INVENTION

Hereinafter, the present invention will be described in more detail with reference to some examples. However, it should be understood that these examples are provided for illustration only and are not to be in any way construed as limiting the present invention.

PREPARATIVE EXAMPLE 1

Manufacturing Diffusion Member

A diffusion member (haze: 55%) having a diffusing agent-containing layer (thickness: 3 μm), which included silica particles having a refractive index of 1.43, on a polyethylene terephthalate film (PET, thickness: 100 μm, refractive index: 1.64) was manufactured.

PREPARATIVE EXAMPLE 2

Manufacturing Diffusion Member

A diffusion member (haze: 75%) having a diffusing agent-containing layer (thickness: 3 μm), which included silica particles having a refractive index of 1.43, on a polyethylene terephthalate film (PET, thickness: 100 μm, refractive index: 1.64) was manufactured.

PREPARATIVE EXAMPLE 3

Manufacturing Diffusion Member

A diffusion member (haze: 95%) having a diffusing agent-containing layer (thickness: 3 μm), which included silica particles having a refractive index of 1.43, on a polyethylene terephthalate film (PET, thickness: 100 μm, refractive index: 1.64, for optics) was manufactured.

PREPARATIVE EXAMPLE 4

Composition for Light-to-Heat Conversion Layer

A binder mixture was prepared by mixing 25 g of polymethylmethacrylate, 40 g of epoxyacrylate as UV curable resins, 17 g of a tri-functional acrylate monomer (SR351, Sartomer) as a polyfunctional monomer, and 3 g of Irgcure 184 (BASF GmbH) as a photo initiator. 15 g of carbon black was added to the binder mixture, followed by stirring for 30 minutes, thereby preparing a composition.

PREPARATIVE EXAMPLE 5

Composition for Interlayer 17.99 g of bi-functional epoxy novolac acrylate (CN112C60, Sartomer) as a UC curable resin, 7.44 g of a tri-functional acrylate monomer (SR351, Sartomer) as a polyfunctional monomer, and 0.62 g of 1H,1H,10H,10H-perfluoro-1,10-decandiol diacrylate (Exfluor Research Corporation) as a UV curable fluorine compound were added to a mixture of 47.15 g of methylethylketone (MEK) and 26.05 g of propylene glycol monomethyl ether acetate, followed by stirring for 30 minutes. As a photo initiator, 0.75 g of Irgacure 184 (BASF GmbH) was added, followed by finally stirring for 30 minutes, thereby preparing a composition.

EXAMPLE 1

Manufacturing of Thermal Transfer Film

A thermal transfer film (having the structure as shown in FIG. 2) was manufactured by sequentially forming the light-to-heat conversion layer of Preparative Example 4 and the interlayer of Preparative Example 5 on the diffusing agent-containing layer of Preparative Example 1.

EXAMPLE 2

Manufacturing of Thermal Transfer Film

A thermal transfer film (having the structure as shown in FIG. 2) was manufactured by sequentially forming the light-to-heat conversion layer of Preparative Example 4 and the interlayer of Preparative Example 5 on the diffusing agent-containing layer of Preparative Example 2 instead of the diffusing agent-containing layer of Preparative Example 1.

EXAMPLE 3

Manufacturing of Thermal Transfer Film

A thermal transfer film (having the structure as shown in FIG. 2) was manufactured by sequentially forming the light-to-heat conversion layer of Preparative Example 4 and the interlayer of Preparative Example 5 on the diffusing agent-containing layer of Preparative Example 3 instead of the diffusing agent-containing layer of Preparative Example 1.

COMPARATIVE EXAMPLE 1

Manufacturing of Thermal Transfer Film

A thermal transfer film was manufactured in the same manner as in Example 1 except that a polyethylene terephthalate film (PET, thickness: 100 μm, refractive index: 1.64, for optics) not including the diffusing agent-containing layer of Preparative Example 1 was used.

Physical properties of the thermal transfer films manufactured as above were evaluated through simulation using LightTool. Results are shown in Table 1.
(1) Defect size: 18 μm Sphere
(2) Defect Height: 37.5 μm (a distance from an incident surface of PET film to defect)
(3) Laser:
Width: 300 μm width/Wavelength: 1064 nm/Emittance: 1 Watt
Spectrum: Gaussian (FWHM 18.839 nm)
(4) Diffuse: 0%/55%/75%/95%
(5) Irradiance: W/mm$^2$

TABLE 1

|  | Example 1 | Example 2 | Example 3 | Comparative Example 1 |
|---|---|---|---|---|
| Haze (%) of diffusion member | 55 | 75 | 95 | — |
| Irradiance (W/mm$^2$) | 4.32 | 5.78 | 7.29 | 1.91 |

* Simulation result_LightTool used

As shown in Table 1, it was confirmed that the thermal transfer films according to the present invention had high irradiance and thus did not suffer from reduction in optical density due to foreign matter in the base film.

It should be understood that various modifications, changes, alterations, and equivalent embodiments can be made by those skilled in the art without departing from the spirit and scope of the invention.

The invention claimed is:

1. A thermal transfer film comprising:
a light-to-heat conversion layer; and
a diffusion member formed on the upper surface of the light-to-heat conversion layer,
wherein the diffusion member has a haze of about 20% to 95%.

2. The thermal transfer film according to claim 1, wherein the diffusion member comprises a base film having a diffusion layer formed thereon or a base film including a diffusing agent.

3. The thermal transfer film according to claim 2, wherein the diffusion layer comprises at least one of an optical pattern layer and a diffusing agent-containing layer.

4. The thermal transfer film according to claim 3, wherein the diffusion member comprises a base film having an optical pattern layer formed at a light incident portion of the thermal transfer film.

5. The thermal transfer film according to claim 4, wherein a difference in refractive index between the optical pattern layer and the base film ranges from about 0.03 to about 0.2.

6. The thermal transfer film according to claim 4, wherein the optical pattern layer comprises at least one optical pattern of a lenticular lens pattern, a microlens pattern, an embossed pattern, and a prism pattern.

7. The thermal transfer film according to claim 4, wherein the optical pattern layer is integrally formed with the base film.

8. The thermal transfer film according to claim 4, wherein the optical pattern layer further comprises a diffusing agent.

9. The thermal transfer film according to claim 3, wherein the diffusion member comprises a base film having the diffusing agent-containing layer formed on one surface thereof.

10. The thermal transfer film according to claim 9, wherein a difference in refractive index between a resin of the diffusing agent-containing layer and the diffusing agent ranges from about 0.03 to about 0.25.

11. The thermal transfer film according to claim 9, wherein the diffusing agent-containing layer has a thickness of about 1 μm to about 20 μm.

12. The thermal transfer film according to claim 9, wherein the diffusing agent-containing layer is formed of a composition comprising a UV curable resin and a diffusing agent.

13. The thermal transfer film according to claim 12, wherein a difference in refractive index between the UV curable resin and the diffusing agent ranges from about 0.03 to about 0.2.

14. The thermal transfer film according to claim 12, wherein the diffusing agent is contained in an amount of about 10 wt % to about 80 wt % in the diffusing agent-containing layer.

15. The thermal transfer film according to claim 12, wherein the UV curable resin comprises at least one of (meth)acrylic, polycarbonate, styrene, olefin, and polyester resins.

16. The thermal transfer film according to claim 12, wherein the diffusing agent comprises at least one of silica, styrene, (meth)acrylic, olefin, polyester, polycarbonate, siloxane, calcium carbonate, and aluminum oxide diffusing agents.

17. The thermal transfer film according to claim 9, wherein the base film further comprises an optical pattern layer formed on the other surface thereof.

18. The thermal transfer film according to claim 17, wherein the optical pattern layer comprises at least one of a lenticular lens pattern, a microlens pattern, an embossed pattern, and a prism pattern.

19. The thermal transfer film according to claim 2, wherein the diffusion member is a base film comprising a diffusing agent.

20. The thermal transfer film according to claim 19, wherein a difference in refractive index between the diffusing agent and the base film ranges from about 0.03 to about 0.25.

21. The thermal transfer film according to claim 19, wherein the diffusing agent is contained in an amount of about 2 wt % to about 50 wt % in the base film.

22. The thermal transfer film according to claim 19, wherein the diffusing agent comprises at least one of silica, styrene, (meth)acrylic, olefin, polyester, polycarbonate, siloxane, calcium carbonate, and aluminum oxide diffusing agents.

23. The thermal transfer film according to claim 1, wherein the light-to-heat conversion layer comprises a cured product of a composition comprising a curable resin, a polyfunctional monomer, and a light-to-heat conversion material.

24. The thermal transfer film according to claim 23, wherein the light-to-heat conversion material comprises at least one of dyes, pigments, carbon black, and tungsten oxide fine particles.

25. The thermal transfer film according to claim 1, further comprising:
    an interlayer stacked on the lower surface of the light-to-heat conversion layer.

26. The thermal transfer film according to claim 25, wherein the interlayer comprises a cured product of a composition comprising a curable resin, a polyfunctional monomer, a curable fluorine compound, and an initiator.

27. An organic electroluminescent device manufactured using the thermal transfer film according to claim 1.

28. A method for manufacturing a thermal transfer film, comprising:
    forming a diffusion member, and
    forming a light-to-heat conversion layer on the diffusion member,
    wherein the diffusion member has a haze of about 20% to 95%.

29. The method according to claim 27, further comprising:
    forming an interlayer on the light-to-heat conversion layer.

* * * * *